United States Patent
Fujimoto

(10) Patent No.: US 7,093,222 B2
(45) Date of Patent: Aug. 15, 2006

(54) POWER SUPPLY WIRING METHOD FOR SEMICONDUCTOR INTEGRATED CIRCUIT AND SEMICONDUCTOR INTEGRATED CIRCUIT

(75) Inventor: Kazuhiko Fujimoto, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/653,940

(22) Filed: Sep. 4, 2003

(65) Prior Publication Data

US 2004/0060030 A1     Mar. 25, 2004

(30) Foreign Application Priority Data

Sep. 24, 2002  (JP) .............................. 2002-277141

(51) Int. Cl.
*G06F 17/50* (2006.01)

(52) U.S. Cl. .................. 716/12; 716/8; 716/9; 716/13; 716/14

(58) Field of Classification Search ............... 716/7–18
See application file for complete search history.

(56) References Cited

U.S. PATENT DOCUMENTS

| | | |
|---|---|---|
| 5,283,753 A | 2/1994 | Schucker et al. |
| 6,054,872 A | 4/2000 | Fudanuki et al. |
| 6,308,309 B1 | 10/2001 | Gan et al. |
| 6,467,074 B1 * | 10/2002 | Katsioulas et al. ........... 716/17 |
| 6,502,225 B1 | 12/2002 | Ishikura |
| 6,553,554 B1 * | 4/2003 | Dahl et al. .................... 716/11 |
| 6,701,509 B1 * | 3/2004 | Aggarwal et al. ............ 716/13 |
| 2002/0038448 A1 | 3/2002 | Ichimiya et al. |

FOREIGN PATENT DOCUMENTS

| | | |
|---|---|---|
| JP | 59155144 | 9/1984 |
| JP | 64059831 | 3/1989 |
| JP | 02082552 | 3/1990 |
| JP | 10242289 | 11/1998 |
| JP | 2000331051 | 11/2000 |

* cited by examiner

*Primary Examiner*—Paul Dinh
(74) *Attorney, Agent, or Firm*—Stevens, Davis, Miller & Mosher, LLP

(57) ABSTRACT

A power supply wiring method for a semiconductor integrated circuit is disclosed in which power supply provision for logic cells can be performed without invading the wiring area, and a semiconductor integrated circuit is also disclosed. In the power supply wiring method, a power supply is fed to logic cells located between the functional blocks of a semiconductor integrated circuit comprising a plurality of functional blocks. In the method, power supply provision similar to that for logic cells in the functional blocks is performed for the logic cells between the functional blocks by aligning logic cell rows in the functional blocks and logic cell rows located between the functional blocks. Thus, power supply provision similar to a power supply feeding method for the logic cells in the functional blocks is also possible for the logic cells located between the functional blocks.

10 Claims, 12 Drawing Sheets

POWER SUPPLY WIRING METHOD FOR SEMICONDUCTOR INTEGRATED CIRCUIT AND SEMICONDUCTOR INTEGRATED CIRCUIT

BACKGROUND OF THE INVENTION

1. Field of the Invention

The present invention relates to a power supply wiring method for a semiconductor integrated circuit for providing a power supply to repeater cells inserted in wiring between the blocks. The present invention also relates to a semiconductor integrated circuit.

2. Description of the Related Art

For reducing the wiring delay of signal wiring connected between functional blocks, as shown in FIG. 12A, a repeater cell inserting method for inserting logic cells 100 and 101 into wiring between blocks is often used. When a power supply is provided for repeater cells inserted in the wiring between the blocks, for example, when the repeater cells are directly connected to a power supply provided around the functional blocks, vias are provided for connecting a power supply layer for the logic cells and a power supply layer provided around the blocks. If thus provided vias are present around the functional blocks, the wiring area is invaded, so that wiring between the blocks is difficult to perform. Therefore, usually, the repeater cells are moved inside the block as shown in FIG. 12B, or a repeater cell block 103 is made as shown in FIG. 12C.

Also, conventionally, when cells are located between blocks, power supply wiring is provided on the wiring area between the blocks, the cells are located below the power supply, and cell power supply wiring and cell ground wiring are provided to intersect the power supply between the blocks and connected to the power supply wiring between the blocks via contacts (For example see Japanese Unexamined Patent Application No. H 2000-331051).

However, the integration size of LSIs increases significantly in the present large scale miniaturization process, so that the number of repeaters inserted in the signal wiring between blocks is several thousands. If the above repeater cell inserting methods are used in such a condition, many steps are required for the process after insertion of repeater cells (moving into blocks, or making repeater blocks) Therefore, in order to reduce the LSI design period, it is required that the repeater cells can be located between functional blocks. Thus, a method of providing a power supply for repeater cells without invading the wiring area is required.

SUMMARY OF THE INVENTION

It is an object of the present invention to provide a power supply wiring method for a semiconductor integrated circuit, in which power supply provision for logic cells can be performed without invading the wiring area, and to provide a semiconductor integrated circuit.

In order to achieve the above object, in a first aspect of the present invention, there is provided a power supply wiring method for a semiconductor integrated circuit comprising a plurality of functional blocks for feeding a power supply to logic cells located between the functional blocks, comprising the step of aligning logic cell rows in the functional blocks and logic cell rows located between the functional blocks to perform for the logic cells between the functional blocks power supply provision similar to that for logic cells in the functional blocks.

According to this constitution, power supply provision similar to a power supply feeding method for the logic cells in the functional blocks is also possible for the logic cells located between the functional blocks. In addition, power supply provision without the invasion of the wiring area is possible for the logic cells between the functional blocks, so that the number of steps for inserting the logic cells into the wiring between the blocks can be reduced.

In a second aspect of the present invention, there is provided a power supply wiring method for a semiconductor integrated circuit comprising a plurality of functional blocks for feeding a power supply to logic cells located between the functional blocks, comprising the steps of providing a cell power supply wiring or a cell ground wiring in the functional block at one side at the height of the functional block; providing a wiring, which is different from the wiring provided in the functional block at one side, at the other side at the height of the functional block; and connecting wirings for the logic cell to the wirings present on both sides of the logic cell, one wiring for the logic cell to one of the wirings, the other wiring for the logic cell to the other one, so as to perform power supply provision for the logic cell.

According to this constitution, a pair of cell power supply wiring and cell ground wiring is present on the right and left sides of the logic cells located between the functional blocks. By connecting each of wirings for the logic cells only to one side in such a state, power supply provision can be performed only with a wiring layer for all logic cell power supplies. Therefore, the wiring area can be secured.

In a third aspect of the present invention, there is provided a power supply wiring method for a semiconductor integrated circuit comprising a plurality of functional blocks for feeding a power supply to logic cells located between the functional blocks, comprising the steps of providing a cell power supply wiring or a cell ground wiring outside the functional block at one side at the height of the functional block; providing a wiring, which is different from the wiring provided outside the functional block at one side, outside the functional block at the other side at the height of the functional block; and connecting wirings for the logic cell to the wirings present on both sides of the logic cell, one wiring for the logic cell to one of the wirings, the other wiring for the logic cell to the other one, so as to perform power supply provision for the logic cell.

According to this constitution, a pair of cell power supply wiring and cell ground wiring is present on the right and left sides of the logic cells located between the functional blocks. By connecting each of wirings for the logic cells only to one side in such a state, power supply provision can be performed only with a wiring layer for all logic cell power supplies, and the width of the wirings provided at both sides of the functional blocks can be changed according to the number of the logic cells located between the functional blocks. Therefore, further optimized power supply provision can be performed.

In a fourth aspect of the present invention, in the above power supply wiring method according to the third aspect of the invention, when the functional block is rotated 90° from a state in which wirings are present on the right and left sides of the logic cells located between the functional blocks, the wiring provided at the top side of the functional block is extended to either one of the right and left sides of the functional block, and the wiring provided at the bottom side of the functional block is extended in a direction opposite to a direction in which the wiring provided at the top side of the functional block is extended.

According to this constitution, even if the functional block is rotated and power supplies for logic cells are provided lengthways, a pair of cell power supply wiring and cell ground wiring is present on the right and left sides of the logic cells located between the functional blocks. By connecting wirings for the logic cell to the right and left wirings in such a state, one wiring for the logic cell to one of the right and left wirings, the other wiring for the logic cell to the other one, power supply provision is possible even if the functional block is rotated and the direction of power supplies in the block is changed.

In a fifth aspect of the present invention, there is provided a power supply wiring method for a semiconductor integrated circuit comprising a plurality of functional blocks for providing wirings on the right and left sides of logic cells located between the functional blocks on the top side of one functional block and on the bottom side of another functional block, comprising the steps of providing cell power supply wirings or cell ground wirings at the top sides of the functional blocks with the width of the functional blocks; providing wirings, which are different from the wirings provided at the top sides of the functional blocks, at the bottom sides of the functional blocks with the width of the functional blocks; providing, for the logic cell located between the functional blocks on the top side of one functional block and on the bottom side of another functional block, a wiring in the direction of the logic cell from the wiring provided at the bottom side of the functional block present on the top side of the logic cell; and providing for the logic cell a wiring in the direction of the logic cell from the wiring provided at the top side of the functional block present on the bottom side of the logic cell so as to provide a cell power supply wiring and a cell ground wiring on the right and left sides of the logic cell.

According to this constitution, a pair of cell power supply wiring and cell ground wiring can be provided on the right and left sides of the logic cells when a pair of cell power supply wiring and cell ground wiring is not present on both sides of the logic cells in power supply provision for the logic cells between the functional blocks. Even in such a case, power supply provision for the logic cells is possible.

In a sixth aspect of the present invention, in the power supply wiring method according to the third aspect of the present invention, the shape of the wirings provided outside the functional blocks is changed according to the number and position of the logic cells located between the functional blocks.

According to this constitution, in providing wirings at both ends of the functional blocks, the position of the logic cells located between the functional blocks is considered so that wirings can be provided only for necessary portions. Thus, no power supply provision for unnecessary portions is performed, so that power supply provision in which the invasion of the wiring area is further reduced is possible.

In a seventh aspect of the present invention, there is provided a power supply wiring method for a semiconductor integrated circuit comprising a plurality of functional blocks having different power supply systems for feeding a power supply to logic cells located between the functional blocks, comprising the steps of extending a wiring, which is provided at least one of the right and left sides of a functional block having the same power supply system as the logic cells among the functional blocks present on the right and left sides of the logic cells, to the top or bottom side of the functional block to provide the wiring in such a manner that the logic cells are located between the wiring and a wiring provided at the other side of the functional block; and connecting wirings for the logic cells to the wirings present on the right and left sides of the logic cells, one wiring for the logic cell to one of the wirings, the other wiring for the logic cell to the other one, so as to perform power supply provision for the logic cells.

According to this constitution, in LSI design, when a plurality of power supply systems are present and the power supply systems of functional blocks present on the right and left sides of the logic cells located between the functional blocks are different from each other, power supply provision from the functional block having the same power supply system to the logic cells located between the blocks can be performed.

In an eighth aspect of the present invention, there is provided a semiconductor integrated circuit comprising a plurality of functional blocks and logic cells located between the functional blocks, wherein a logic cell location area is provided between the functional blocks in such a manner that the logic cell location area and logic cell location areas provided in the functional blocks are continuous.

According to this constitution, power supply provision similar to a power supply feeding method for the logic cells in the functional blocks is also possible for the logic cells located between the functional blocks.

In a ninth aspect of the present invention, there is provided a semiconductor integrated circuit comprising a plurality of functional blocks and logic cells located between the functional blocks, wherein a cell power supply wiring or a cell ground wiring is provided in the functional block at one side at the height of the functional block, a wiring different from the wiring provided in the functional block at one side is provided at the other side at the height of the functional block, and a pair of the cell power supply wiring and the cell ground wiring is present on both sides of the logic cells.

According to this constitution, by connecting each of wirings for the logic cells only to one side, power supply provision can be performed only with a wiring layer for all logic cell power supplies. Therefore, the wiring area can be secured.

In a tenth aspect of the present invention, there is provided a semiconductor integrated circuit comprising a plurality of functional blocks and logic cells located between the functional blocks, wherein a cell power supply wiring or a cell ground wiring is provided outside the functional block at one side at the height of the functional block, a wiring different from the wiring provided outside the functional block at one side is provided outside the functional block at the other side at the height of the functional block, and a pair of the cell power supply wiring and the cell ground wiring is present on both sides of the logic cells.

According to this constitution, by connecting each of wirings for the logic cells only to one side, power supply provision can be performed only with a wiring layer for all logic cell power supplies, and the width of the wirings provided at both sides of the functional blocks can be changed according to the number of the logic cells located between the functional blocks. Therefore, further optimized power supply provision can be performed.

In an eleventh aspect of the present invention, in the semiconductor integrated circuit according to the tenth aspect of the present invention, the functional block is rotated 90° so that wirings are wired at top and bottom sides, the wiring provided at the top side of the functional block is extended to either one of the right and left sides of the functional block, and the wiring provided at the bottom side of the functional block is extended in a direction opposite to a direction in which the wiring provided at the top side of the functional block is extended.

According to this constitution, power supply provision is possible even if the functional block is rotated and the direction of power supplies in the block is changed.

In a twelfth aspect of the present invention, there is provided a semiconductor integrated circuit comprising a plurality of functional blocks, logic cells located between the functional blocks on the top side of one functional block and on the bottom side of another functional block, and wirings provided on the right and left sides of the logic cell, wherein cell power supply wirings or cell ground wirings are provided at the top sides of the functional blocks with the width of the functional blocks, wirings different from the wirings provided at the top sides of the functional blocks are provided at the bottom sides of the functional blocks with the width of the functional blocks, and for the logic cell located between the functional blocks on the top side of one functional block and on the bottom side of another functional block, a wiring is provided in the direction of the logic cell from the wiring provided at the bottom side of the functional block present on the top side of the logic cell, and a wiring is provided in the direction of the logic cell from the wiring provided at the top side of the functional block present on the bottom side of the logic cell.

According to this constitution, power supply provision for the logic cells is possible even if a pair of cell power supply wiring and cell ground wiring is not present on both sides of the logic cells in power supply provision for the logic cells between the functional blocks.

In a thirteenth aspect of the present invention, there is provided a semiconductor integrated circuit comprising a plurality of functional blocks having different power supply systems and logic cells located between the functional blocks, wherein a wiring, which is provided at least one of the right and left sides of a functional block having the same power supply system as the logic cells among functional blocks present on the right and left sides of the logic cells, is extended to the top or bottom side of the functional block and provided in such a manner that the logic cells are located between the wiring and a wiring provided at the other side of the functional block.

According to this constitution, in LSI design, when a plurality of power supply systems are present and the power supply systems of functional blocks present on the right and left sides of the logic cells located between the functional blocks are different from each other, power supply provision from the functional block having the same power supply system to the logic cells located between the blocks can be performed.

DETAILED DESCRIPTION OF THE INVENTION

Figure 1A:
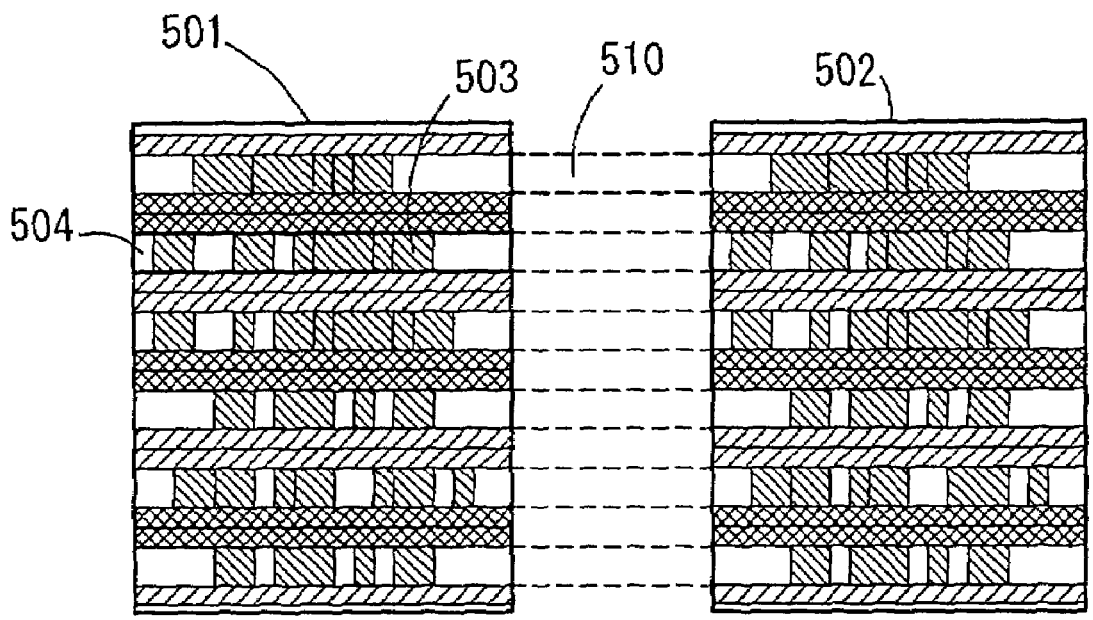
FIG. 1A is an explanation view showing a state in which location areas inside and outside functional blocks are provided in the first embodiment of the present invention.
Figure 1B:
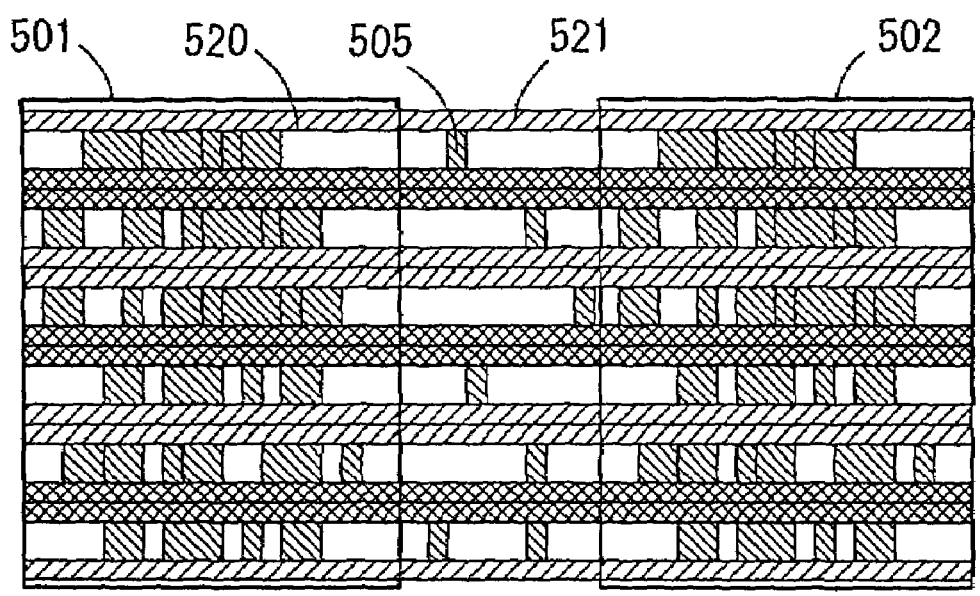
FIG. 1B is an explanation view showing a state in which power supply wiring is completed.

A first embodiment of the present invention is described with reference to FIGS. 1A, 1B, 2A, and 2B. FIG. 1A is an explanation view showing a state in which location areas inside and outside functional blocks are provided in the first embodiment of the present invention, FIG. 1B is an explanation view showing a state in which power supply wiring is completed, FIG. 2A is an explanation view showing logic cell location areas provided in the functional block in the first embodiment of the present invention, and FIG. 2B is an explanation view showing a state in which logic cells are located in the functional block.

Figure 2A:
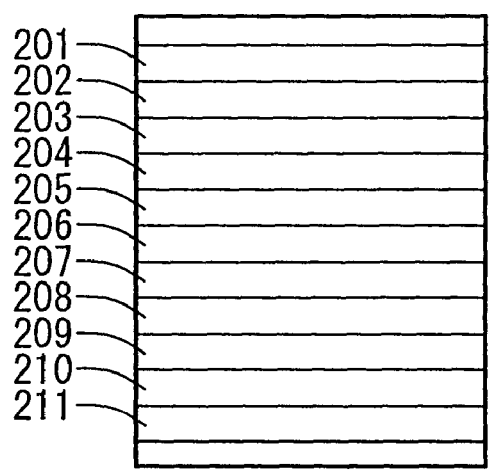
FIG. 2A is an explanation view showing logic cell location areas provided in the functional block in the first embodiment of the present invention.
Figure 2B:
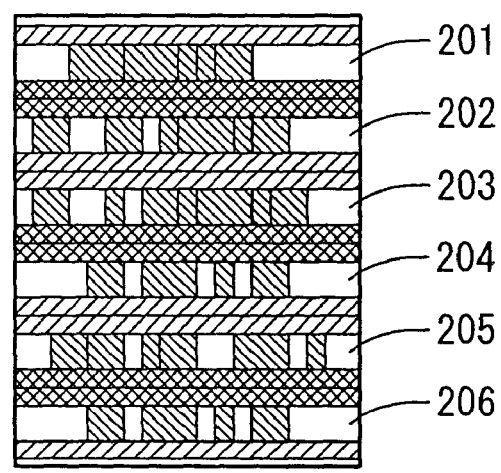
FIG. 2B is an explanation view showing a state in which logic cells are located in the functional block.

In designing the functional blocks of a semiconductor integrated circuit comprising a plurality of functional blocks, areas 201 to 211 for locating logic cells should be provided previously as shown in FIG. 2A. Usually, location of logic cells in the functional blocks is performed according to these areas (FIG. 2B). Logic cell location areas similar to those provided in the functional blocks are provided between the blocks.

FIG. 1A shows a state in which logic cells 503 are located in functional blocks 501 and 502. Power supply provision similar to that for the logic cells 503 in the functional blocks is performed for logic cells 505 between the functional blocks by aligning logic cell rows in the functional blocks and logic cell rows located between the functional blocks.

In this case, the logic cells 503 are housed in logic cell location areas 504. Usually, the logic cell location areas 504 have the same height as the logic cells 503 in the blocks. The logic cell location areas 504 are provided in the blocks before locating the logic cells 503 in the blocks, and then the logic cells are located. Logic cell location areas 510 are provided between the blocks in such a manner that the logic cell location areas 504 provided in the functional blocks 501 and 502 and the logic cell location areas 510 between the blocks have the same height and are aligned. By performing such provision, as shown in FIG. 1B, logic cell power supplies 521 between the blocks can be made common to logic cell power supplies 520 provided in the blocks. Therefore, power supply provision similar to that in the blocks can be performed for the logic cells between the blocks.

Figure 3A:
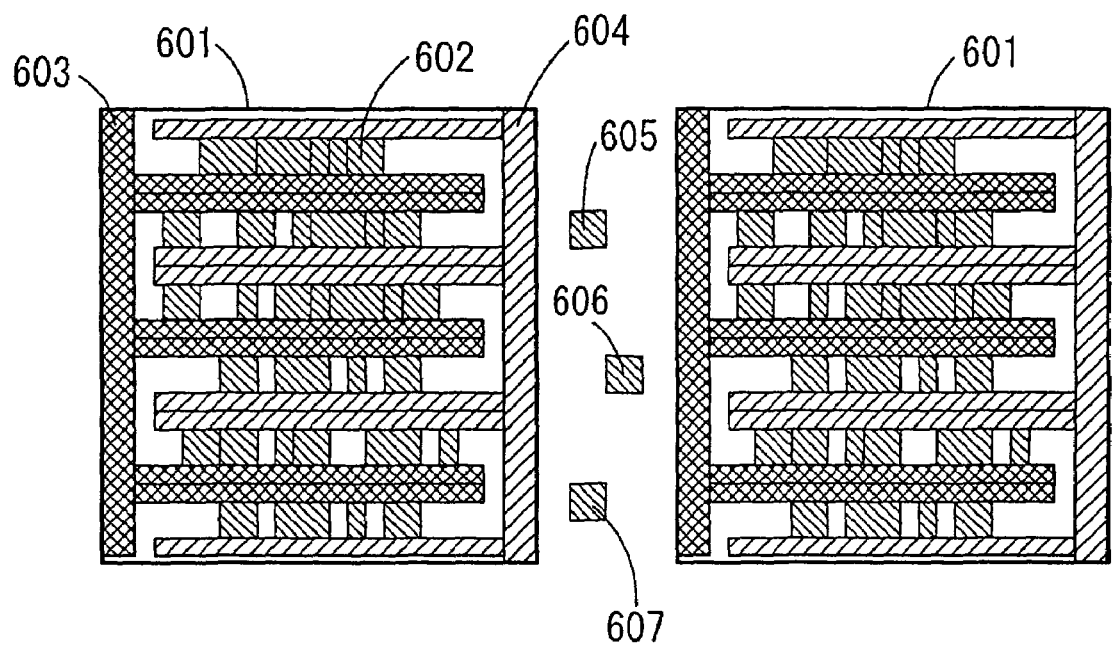
FIG. 3A is an explanation view showing a state in which wirings are provided at both sides in functional blocks in the second embodiment of the present invention.
Figure 3B:
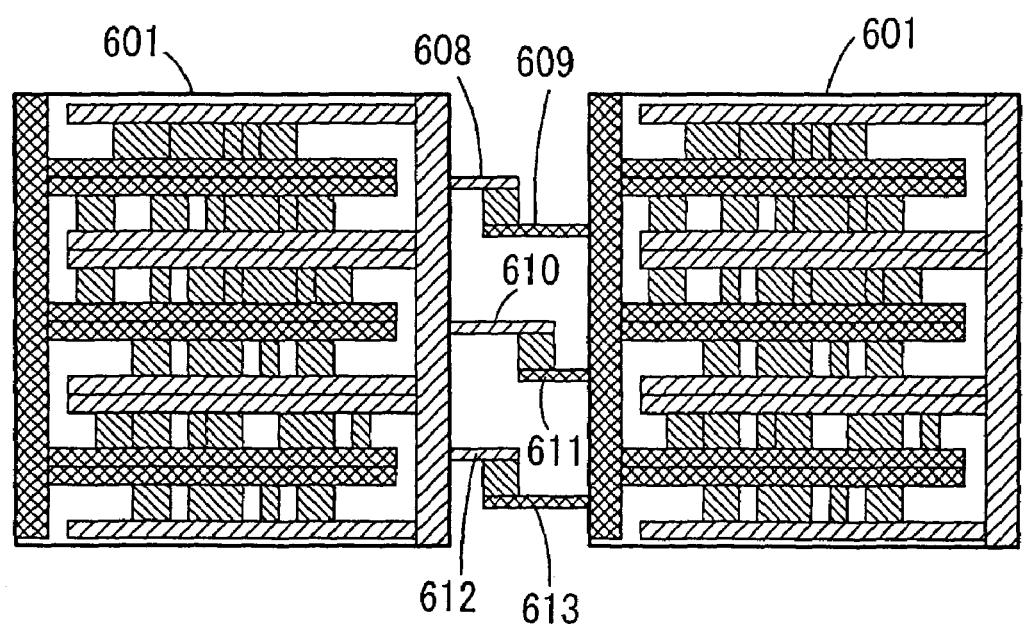
FIG. 3B is an explanation view showing a state in which power supply wiring is completed.

A second embodiment of the present invention is described with reference to FIGS. 3A, 3B, and 4. FIG. 3A is an explanation view showing a state in which wirings are provided at both sides in functional blocks in the second embodiment of the present invention, and FIG. 3B is an explanation view showing a state in which power supply wiring is completed.

In designing the functional blocks of a semiconductor integrated circuit comprising a plurality of functional blocks, a logic power supply wiring (hereinafter referred to as VDD wiring) or a logic ground wiring (hereinafter referred to as VSS wiring) is provided in the functional block at the left end at the height of the functional block. Also, a wiring different from that already provided at the left end is provided in the functional block at the right end at the height of the functional block. When the functional block is designed in such a manner, a pair of VDD and VSS wirings is present on the right and left sides of logic cells located between the blocks.

FIG. 3A shows a state in which logic cells 602 are located in functional blocks 601, and a VDD wiring 603 and a VSS wiring 604 are provided in the functional block at the left and right sides at the height of the functional block. The cell power supply wiring 603 or the cell ground wiring 604 is provided in the functional block 601 at one side at the height of the functional block 601, and a wiring different from that provided in the functional block 601 at one side is provided at the other side at the height of the functional block 601. Wirings for each of logic cells 605, 606, and 607 are connected to the wirings 603 and 604 present on both sides of the logic cells, one wiring for each logic cell being connected to one of the wirings 603 and 604, the other wiring for each logic cell being connected to the other one. Thus, power supply provision for the logic cells is performed.

In this case, the same wiring layer as that used for power supply for the logic cells between the blocks is used for the VDD wiring 603 and the VSS wiring 604. The power supplies for the logic cells in the block are connected to the VDD wiring 603 and the VSS wiring 604 provided at the ends of the block. By previously performing such power supply provision for the functional blocks, the VDD wiring 603 and the VSS wiring 604 are present on the right and left sides of the logic cells 605, 606, and 607 located between the blocks. Then, the wirings for the logic cells located between the blocks are connected to the VDD wiring 603 and the VSS wiring 604 provided in the blocks (wirings 608 to 613). The state in which this process is performed is shown in FIG. 3B.

Figure 4:
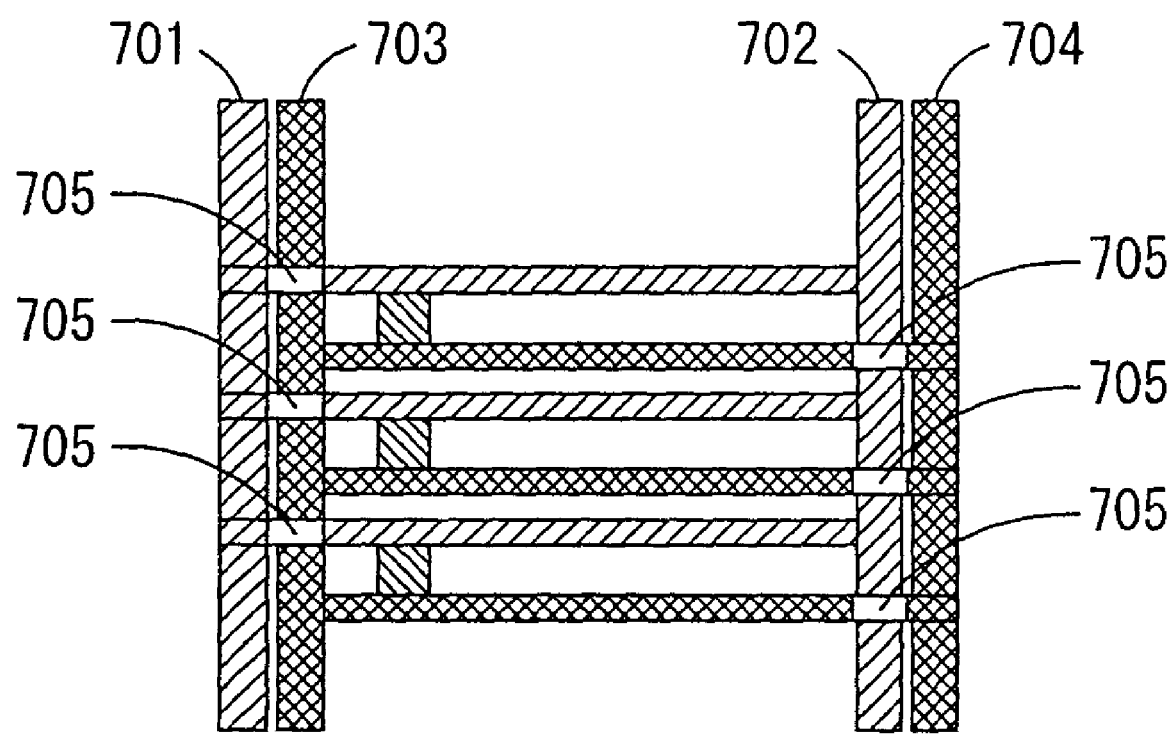
FIG. 4 is an explanation view showing connection of VDD and VSS wirings to wirings for logic cells when the VDD and VSS wirings are present on both sides of the logic cells.

Usually, when power supply is fed to logic cells, as shown in FIG. 4, VDD wirings 701 and 702 and VSS wirings 703 and 704 are provided on both sides of the cells, and wiring connection is performed for the both sides. When wiring connection is performed in such a manner, wiring crossovers 705 occur as shown in FIG. 4, leading to the reduction of the wiring area. On the other hand, as shown in FIG. 3B, when each wiring is connected only to one side, no wiring crossover occurs. Therefore, the wiring area can be secured.

Figure 5A:
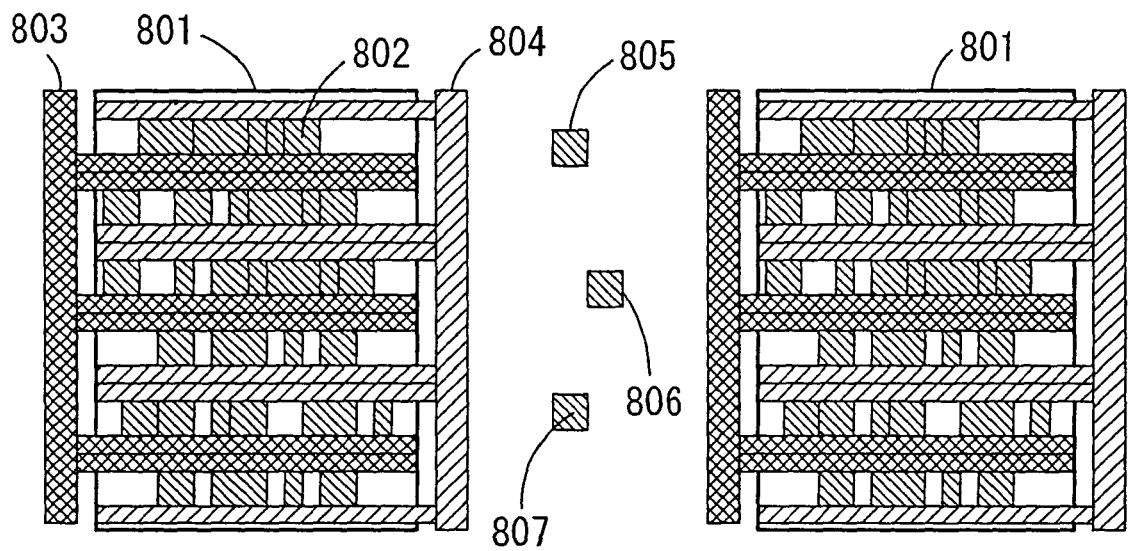
FIG. 5A is an explanation view showing a state in which wirings are provided at both sides outside functional blocks in the third embodiment of the present invention.
Figure 5B:
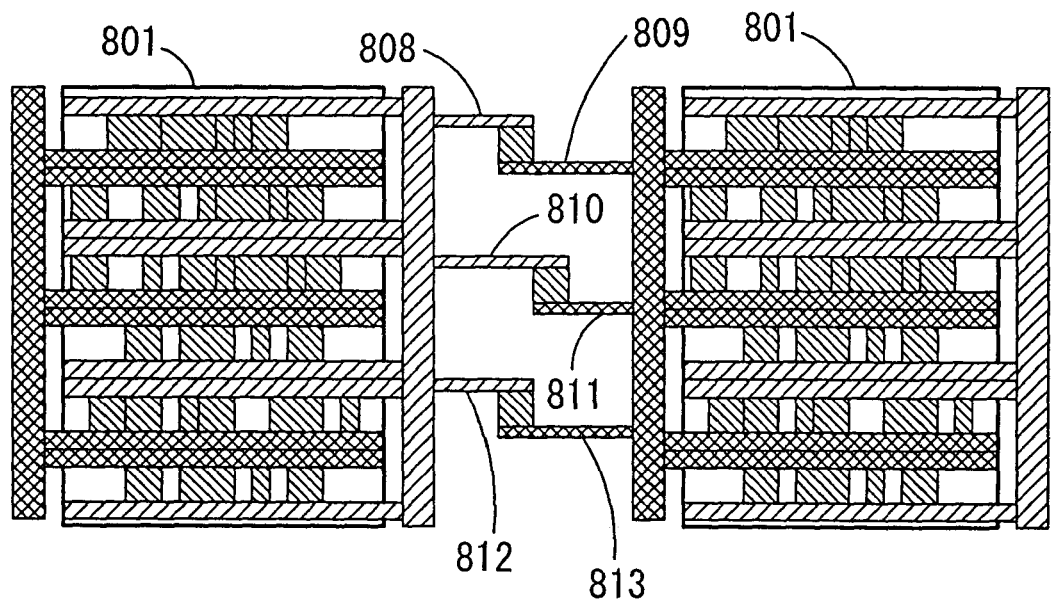
FIG. 5B is an explanation view showing a state in which power supply wiring is completed.

A third embodiment of the present invention is described with reference to FIGS. 5A and 5B. FIG. 5A is an explanation view showing a state in which wirings are provided at both sides outside functional blocks in the third embodiment of the present invention, and FIG. 5B is an explanation view showing a state in which power supply wiring is completed.

A VDD or VSS wiring is provided at the left side of the functional block of a semiconductor integrated circuit comprising a plurality of functional blocks, and a wiring different from that provided at the left side is provided at the right side. Power supplies for logic cells in the block are connected to the right and left wirings provided. When the wirings are provided at both sides of the functional block in such a manner, a pair of VDD and VSS wirings is present on the right and left sides of logic cells located between the blocks.

FIG. 5A shows a state in which logic cells 802 are located in functional blocks 801, and a VDD wiring 803 and a VSS wiring 804 are provided outside the functional block at left and right sides. The cell power supply wiring 803 or the cell ground wiring 804 is provided outside the functional block at one side at the height of the functional block 801, and a wiring different from that provided outside the functional block 801 at one side is provided outside the functional block 801 at the other side at the height of the functional block 801. Wirings for each of logic cells 805, 806, and 807 are connected to the wirings 803 and 804 present on both sides of the logic cells, one wiring for each logic cell being connected to one of the wirings 803 and 804, the other wiring for each logic cell being connected to the other one. Thus, power supply provision for the logic cells is performed.

In this case, the same wiring layer as that used for power supply for the logic cells between the blocks is used for the VDD wiring 803 and the VSS wiring 804. The VDD wiring 803 and the VSS wiring 804 provided at both ends of the block are connected to the power supplies for the logic cells in the block. By previously performing such power supply provision for the functional blocks, the VDD wiring 803 and the VSS wiring 804 are present on the right and left sides of the logic cells 805 to 807 located between the blocks. Then, the wirings for the logic cells located between the blocks are connected to the VDD wiring 803 and the VSS wiring 804 provided in the blocks (wirings 808 to 813). The state in which this process is performed is shown in FIG. 5B.

When such power supply provision for the logic cells is performed, no wiring crossover occurs. Therefore, the wiring area can be secured. In addition, the width of the wirings provided outside the blocks can be changed according to the number of repeater cells located between the blocks and the number of logic cells located in the logic cell location areas, so that more optimum power supply provision is possible than the power supply providing method illustrated in the second embodiment.

Figure 6A:
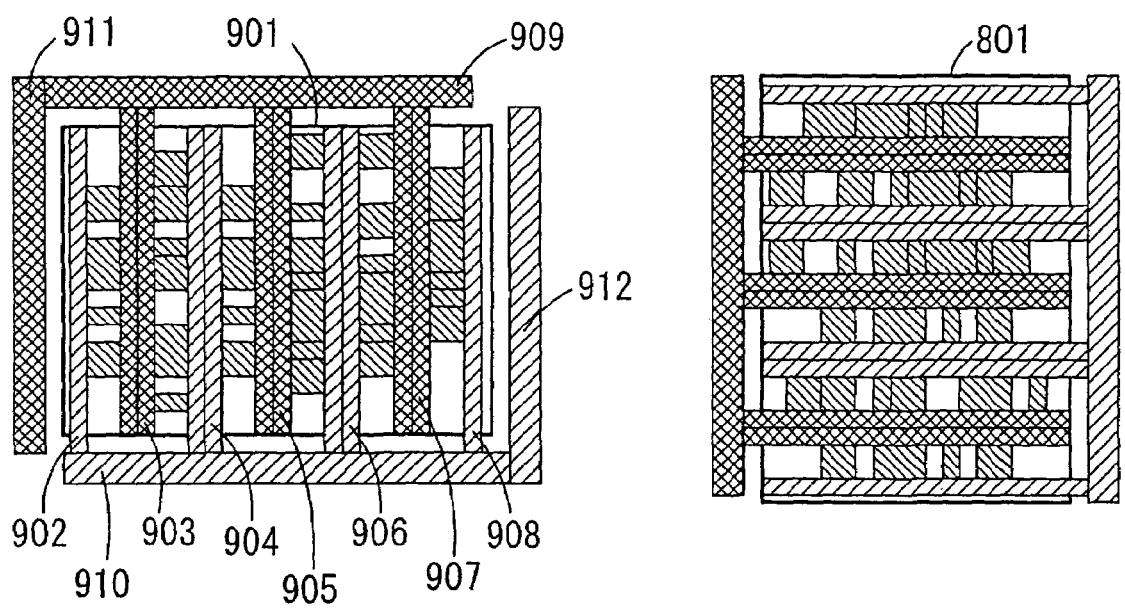
FIG. 6A is an explanation view showing a state in which wirings are provided at both sides outside functional blocks in the fourth embodiment of the present invention.
Figure 6B:
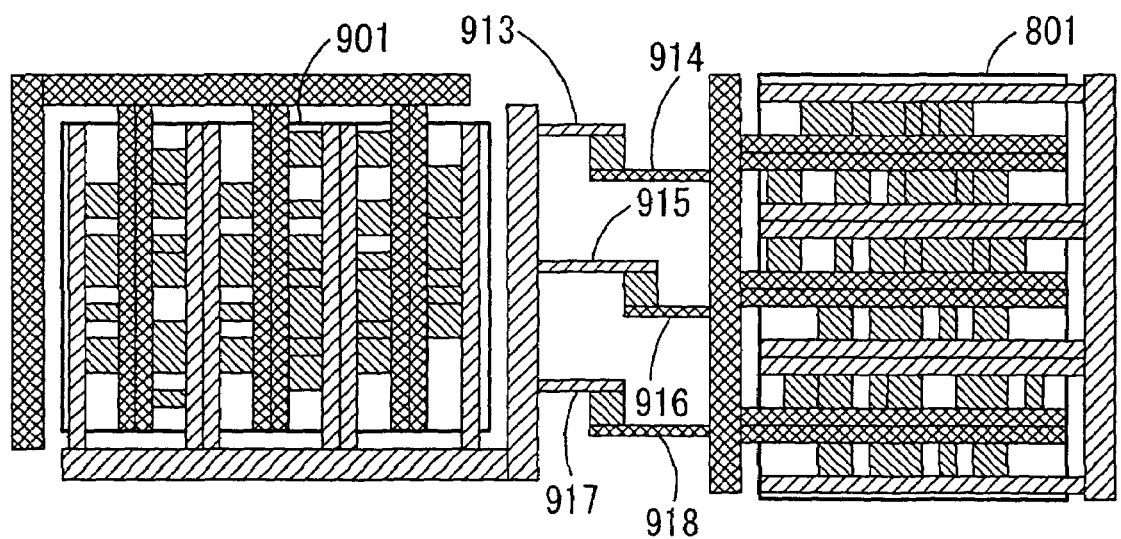
FIG. 6B is an explanation view showing a state in which power supply wiring is completed.
Figure 7:
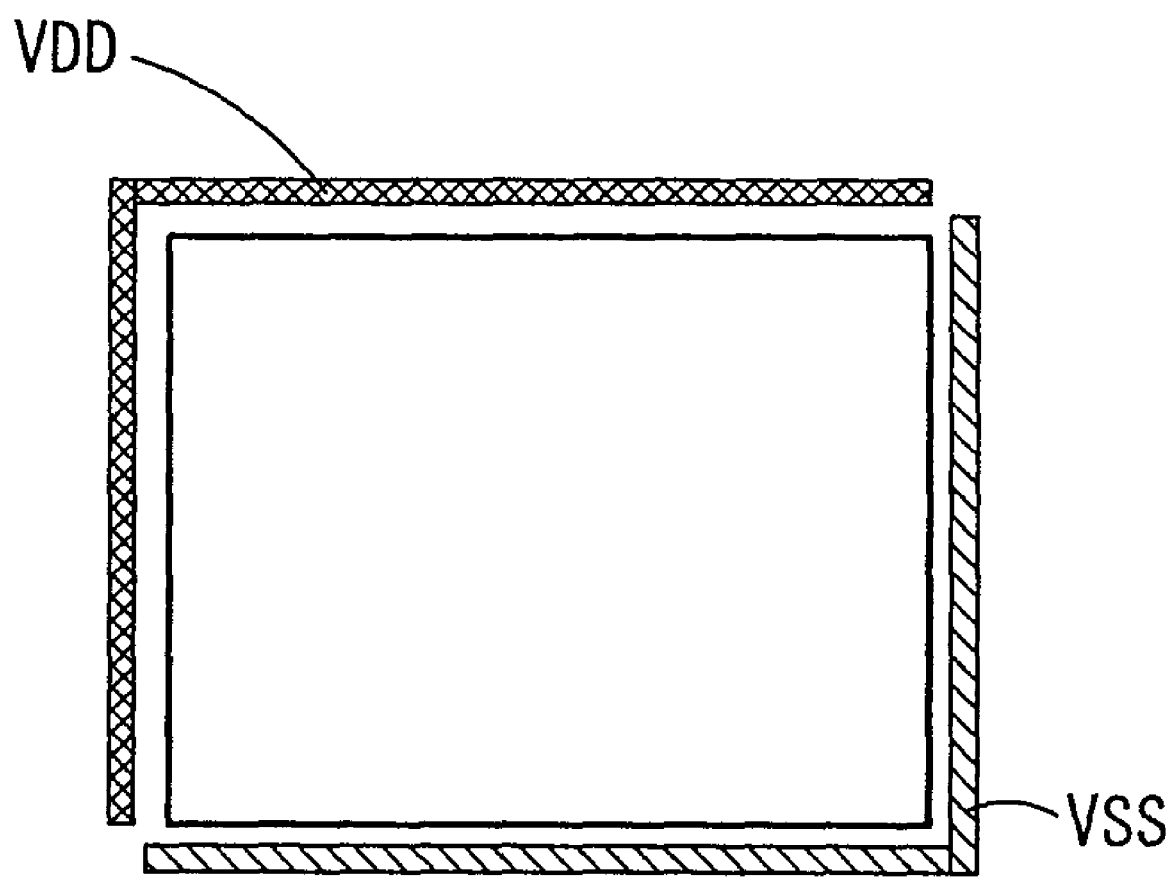
FIG. 7 is an explanation view showing the fourth embodiment of the present invention.

A fourth embodiment of the present invention is described with reference to FIGS. 6A, 6B, and 7. FIG. 6A is an explanation view showing a state in which wirings are provided at both sides outside functional blocks in the fourth embodiment of the present invention, and FIG. 6B is an explanation view showing a state in which power supply wiring is completed.

In performing the process of LSI chip layout, part of functional blocks are rotated in some cases. In these cases, logic cell location areas provided in the blocks are also rotated, and power supply wirings for logic cells are wired lengthways. In these cases, wirings cannot be provided at the right and left sides of the functional block as described in the third embodiment. Therefore, when the functional block is rotated and the power supplies for the logic cells are provided lengthways, VDD and VSS wirings are provided at the top and bottom sides of the functional block, one of the VDD and VSS wirings being provided at one of the top and bottom sides, the other wiring being provided at the other side. The wiring provided at the top side is extended to the right side of the functional block, and the wiring provided at the bottom side is extended to the left side of the functional block. This is called "reed screen-type power supply provision" (FIG. 7). When the wirings are provided for the functional blocks in such a manner, a pair of the VDD and VSS wirings is present on the right and left sides of logic cells located between the blocks.

FIG. 6A shows a power supply providing method in the case where a functional block 901 is rotated. When the functional block 901 is rotated 90° from the state in which wirings are present on the right and left sides of logic cells located between functional blocks, a wiring 909 provided at the top side of the functional block is extended to either one of the right and left sides of the functional block 901, and a wiring 910 provided at the bottom side of the functional block 901 is extended in the direction opposite to the direction in which the wiring 909 provided at the top side of the functional block 901 is extended. In such a state, wirings for each of the logic cells are connected to the right and left wirings, one wiring for each logic cell being connected to one of the right and left wirings, the other wiring for each logic cell being connected to the other one.

In this case, when the functional block 901 is rotated, the direction of the wiring area is changed, so that power supply wirings 902 to 908 for logic cells are provided lengthways as shown in FIG. 6A. In such a case, the VDD wiring 909 and the VSS wiring 910 are provided at the top and bottom sides of the block. Then, the VDD wiring 909 at the top side is extended to the left side of the block (an extended portion 911 in FIG. 6A), and similarly the VSS wiring at the bottom side is extended to the right side of the block (an extended portion 912 in FIG. 6A) to provide the "reed screen-type wiring." By performing such power supply provision, wirings 913 to 918 can be provided in a manner similar to that of the third embodiment as described above, and the case where the functional block 901 is rotated can also be addressed.

Figure 8A:
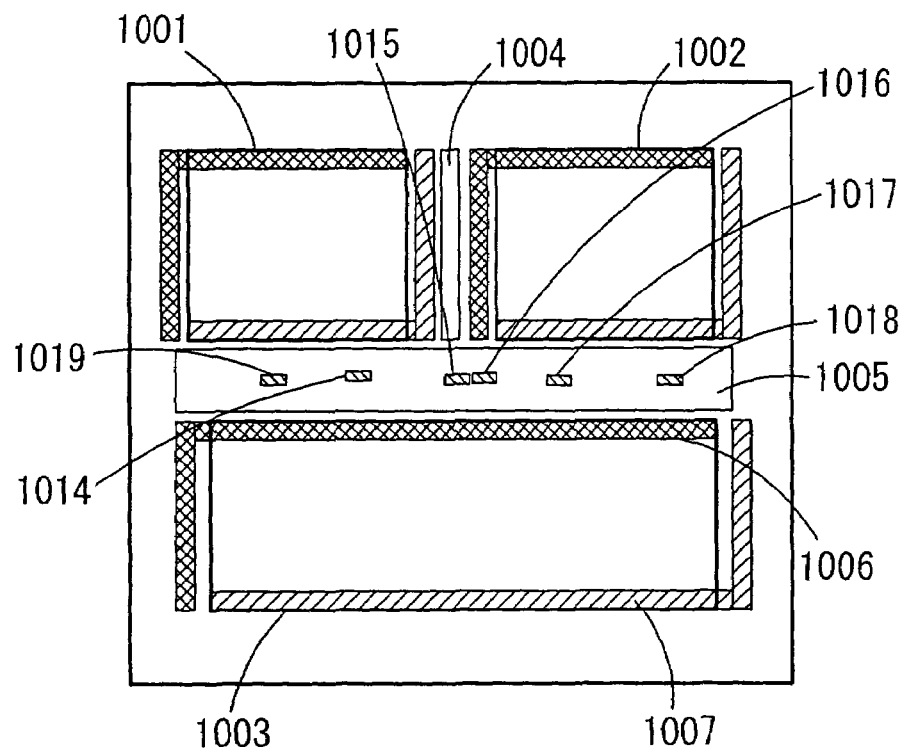
FIG. 8A is an explanation view showing a state in which wirings are provided at the top and bottom sides of functional blocks in the fifth embodiment of the present invention.
Figure 8B:
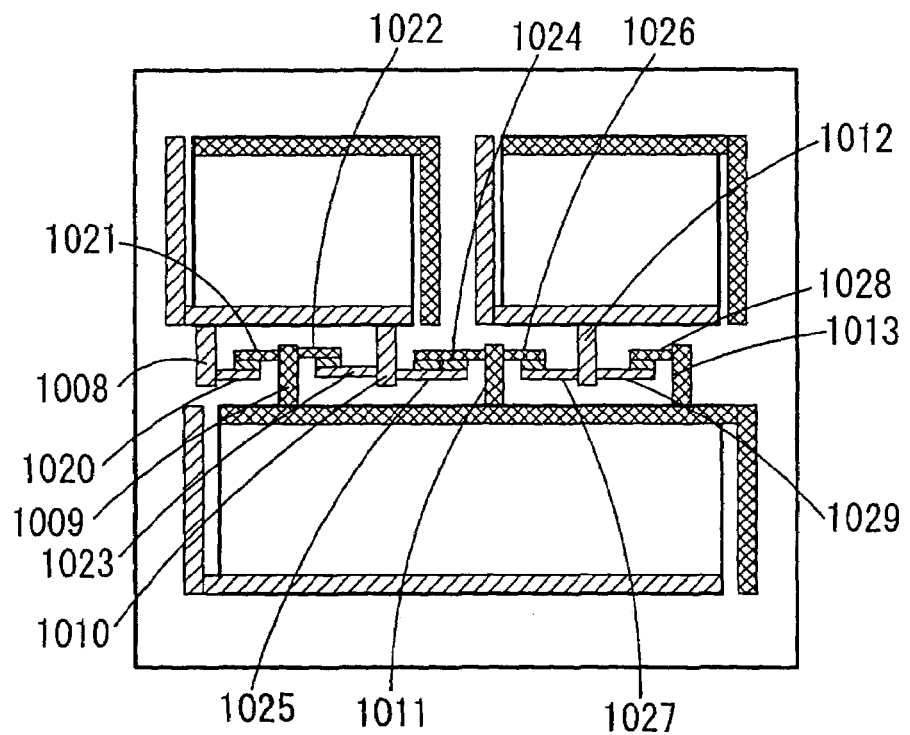
FIG. 8B is an explanation view showing a state in which power supply wiring is completed.
Figure 9:
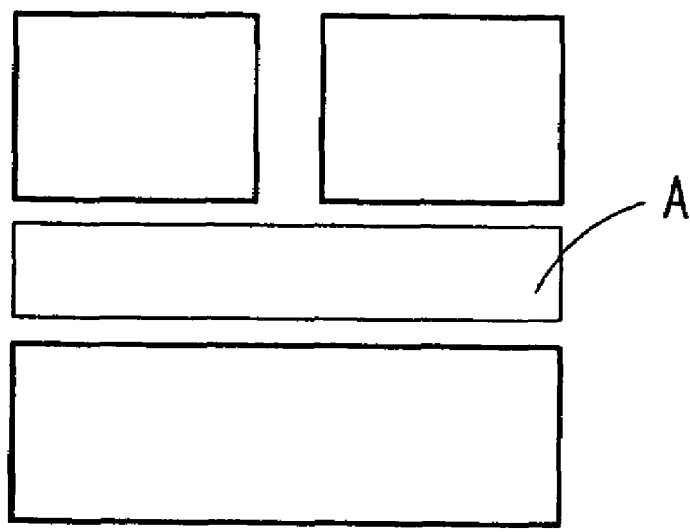
FIG. 9 is an explanation view showing the fifth embodiment of the present invention.

A fifth embodiment of the present invention is described with reference to FIGS. 8A, 8B, and 9. FIG. 8A is an explanation view showing a state in which wirings are provided at the top and bottom sides of functional blocks in the fifth embodiment of the present invention, and FIG. 8B is an explanation view showing a state in which power supply wiring is completed.

In power supply provision for the logic cells between the blocks in the embodiments as described above, a pair of VDD and VSS wirings should necessarily be present on both sides of the logic cells. However, in considering the block location as shown in FIG. 9, a pair of VDD and VSS wirings cannot be provided in the hatched portion A in FIG. 9 by the above methods. In such a case, the VDD and VSS wirings are also provided at the top and bottom sides of the functional blocks, and the branch lines of the VDD and VSS wirings are drawn from the top and bottom sides of the blocks. Thus, a pair of VDD and VSS wirings can be provided on the right and left sides of the logic cells located in the hatched portion A in FIG. 9.

In other words, in considering the state in which functional blocks 1001 to 1003 are located as shown in FIG. 8A, power supply provision can be performed for logic cells located in an area 1004 by employing the third embodiment as described above. However, power supply provision cannot be performed for logic cells 1014 to 1019 located in an area 1005 by the above-described methods.

Then, cell power supply wirings 1006 or cell ground wirings 1007 are provided at the top ends of the functional blocks 1001 to 1003 with the width of the functional blocks, and wirings different from those provided at the top ends of the functional blocks are provided at the bottom ends of the functional blocks with the width of the functional blocks. Then, for the logic cells 1014 to 1019 located between the top and bottom functional blocks, wirings are provided in the direction of the logic cells from the wirings provided at the bottom sides of the functional blocks present on the top sides of the logic cells, and wirings are provided in the direction of the logic cells from the wiring provided at the top side of the functional block present on the bottom sides of the logic cells so as to provide cell power supply wirings and cell ground wirings on the right and left sides of the logic cells.

In this case, when the VDD wirings 1006 and the VSS wirings 1007 are provided in the functional blocks at the top and bottom ends, and wiring branch lines 1008 to 1013 are drawn from the VDD wiring 1006 and the VSS wirings 1007 into the area 1005 as shown in FIG. 8B, a pair of VDD and VSS wirings can be provided on the right and left sides of each of the logic cells provided in the area 1005. Therefore, wirings 1020 to 1029 similar to the wirings of the third embodiment can be provided for the logic cells.

Figure 10:
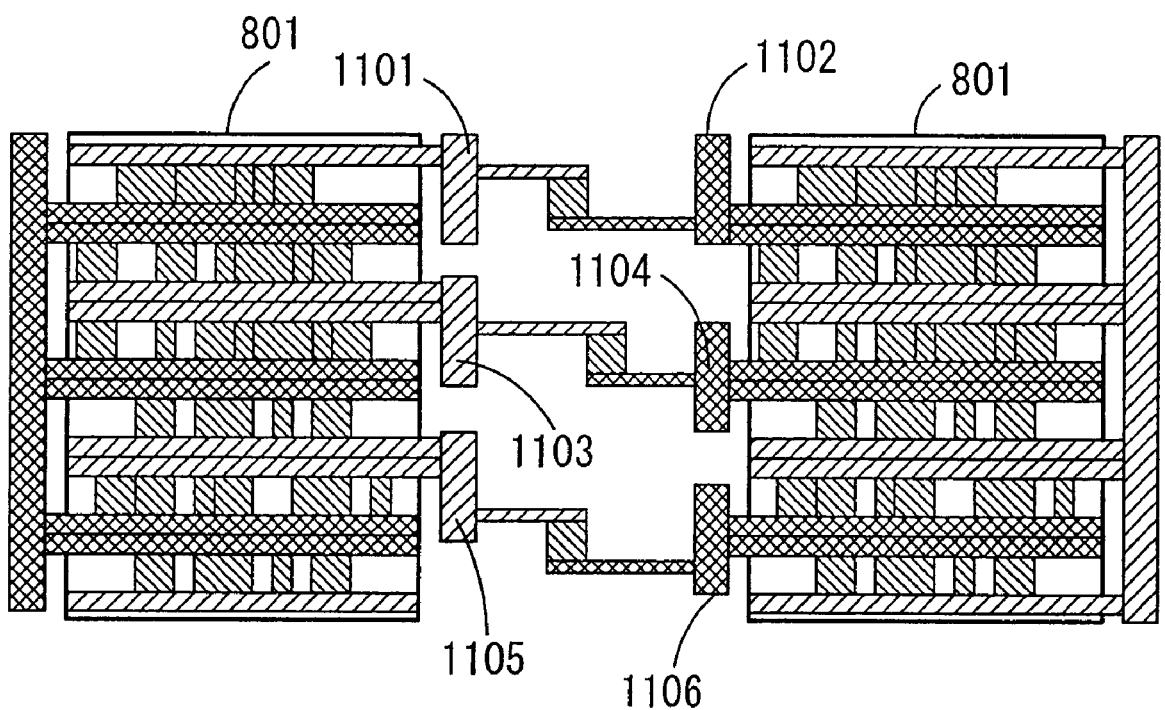
FIG. 10 is an explanation view showing the sixth embodiment of the present invention.

A sixth embodiment of the present invention is described with reference to FIG. 10. FIG. 10 is an explanation view showing the sixth embodiment of the present invention.

In providing wirings at both ends of the functional blocks of a semiconductor integrated circuit comprising a plurality of functional blocks, the position of logic cells located between the blocks is considered to provide wirings only for necessary portions.

In other words, as shown in FIG. 10, in the third embodiment, the shape of wirings provided outside the functional blocks is changed according to the number and position of logic cells located between the functional blocks. While in the third embodiment, the case where wirings are provided outside the blocks at the right and left sides is described, in this embodiment, wirings are provided only near the position of the logic cells located between the functional blocks (wirings 1101 to 1106 in FIG. 10). According to this method, wirings need not be provided in unnecessary areas. Therefore, a larger wiring area can be secured than by the method of the third embodiment.

Figure 11A:
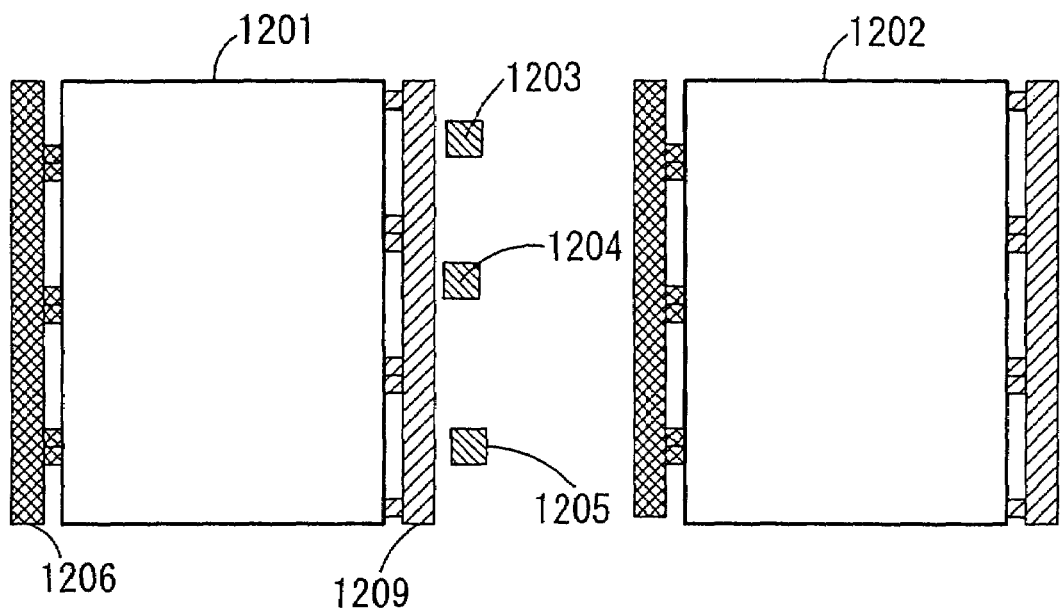
FIG. 11A is an explanation view showing a state in which wirings are provided in the seventh embodiment of the present invention.
Figure 11B:
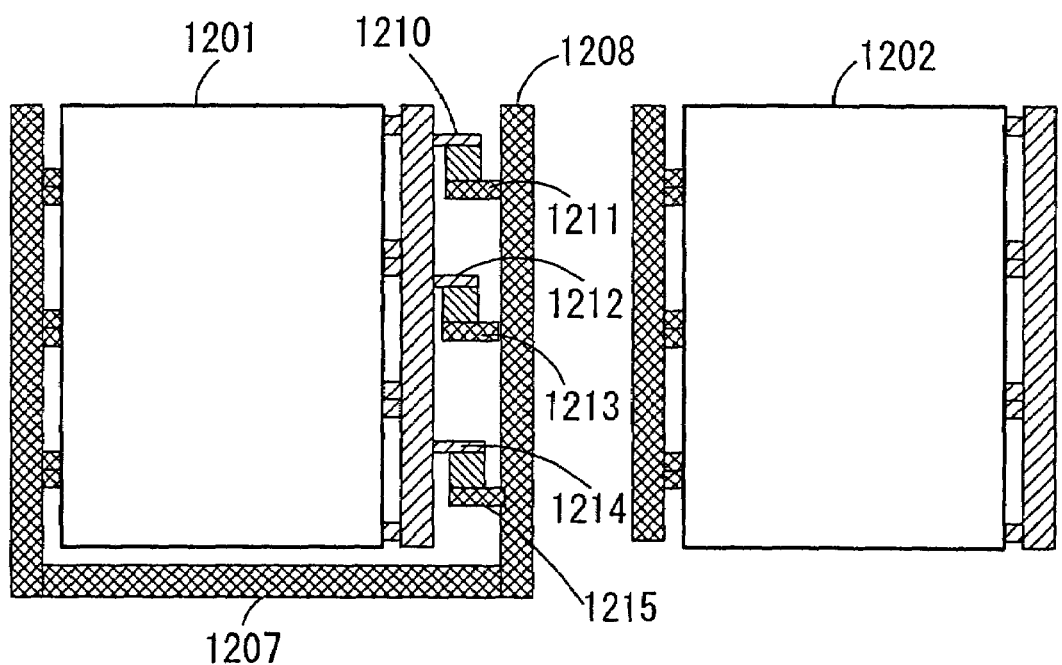
FIG. 11B is an explanation view showing a state in which power supply wiring is completed.
Figure 12A:
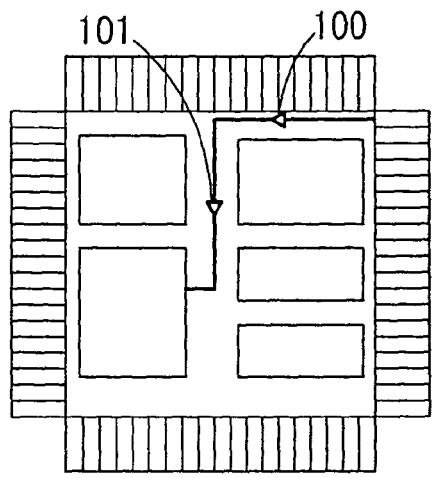
FIG. 12 is an explanation view showing a conventional repeater insertion method.
Figure 12B:
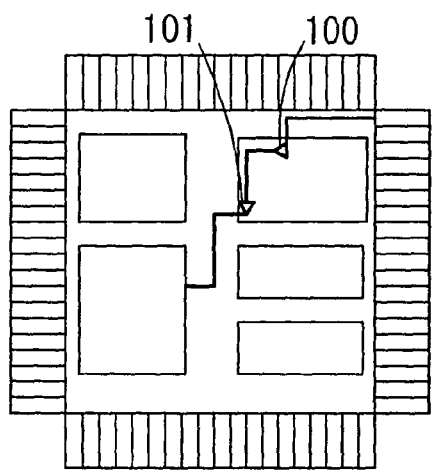
Figure 12C:
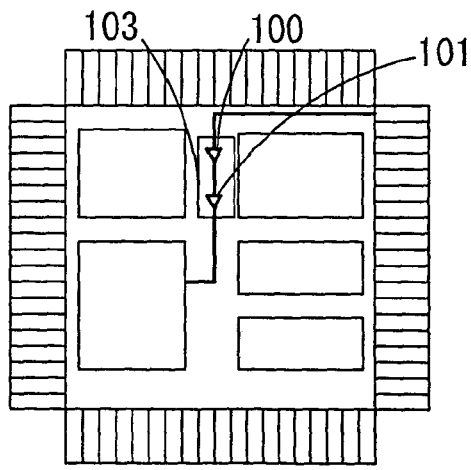

A seventh embodiment of the present invention is described with reference to FIGS. 11A and 11B. FIG. 11A is an explanation view showing a state in which wirings are provided in the seventh embodiment of the present invention, and FIG. 11B is an explanation view showing a state in which power supply wiring is completed.

In LSI design, when a plurality of power supply systems are present (for example, 3.3 V functional blocks and 1.8 V functional blocks), there is a possibility that the power supply systems of functional blocks present on the right and left sides of logic cells located between the blocks are different from each other. In this case, the above power supply providing methods such as the third embodiment cannot be used. Therefore, for providing power supply from the block having the same power supply system as the logic cells located between the blocks, wirings provided at the right and left sides of the functional block are used to provide the wiring provided at the left side of the block also at the bottom and right sides of the functional block. The wiring provided at the right side of the block is also provided at the top and left sides of the functional block. Thus, power supply provision from the functional block having the same power supply system to the logic cells located between the blocks can be performed.

FIG. 11A shows a functional block 1201 which is driven by a power supply system POW1, a functional block 1202 which is driven by a power supply system POW2, and logic cells 1203 to 1205 which are located between the blocks driven by the power supply system POW1. In this case, power supply cannot be fed from the functional block 1202 to the logic cells 1203 to 1205, so that power supply feeding by a method such as the third embodiment is impossible. Therefore, as shown in FIG. 11B, a VDD wiring 1206 provided at the left side of the functional block 1201 is extended to the bottom side of the functional block (a wiring 1207) and is further extended to the right side so as to provide a wiring in such a manner that the logic cells 1203 to 1205 are located between the wiring and a VSS wiring 1209 (a wiring 1208). Also, although not shown in FIG. 11B, the wiring provided at the right side of the functional block may be extended to the left side of the functional block in such a manner that the wiring does not overlap the wiring provided by extending the wiring at the left side of the functional block. By providing the wirings in such a manner, the VDD and VSS wirings can be provided for the logic cells between the blocks using the same power supply system, so that wirings 1210 to 1215 similar to the wirings of the third embodiment can be provided.

While in this embodiment, the VDD wiring is provided inside or outside of the functional block at the left side (bottom side), and the VSS wiring is provided at the right side (top side), similar effects can be obtained when the VSS wiring is provided at the left side (bottom side) and the VDD wiring is provided at the right side (top side). If the VDD and VSS wirings provided in the block are provided in a wiring layer different from that used for power supply for the logic cells between the blocks, power supply provision in which the wiring area is secured cannot be performed because vias are formed when the wirings are connected to the power supply for the logic cells.

What is claimed is:

1. A power supply wiring method for a semiconductor integrated circuit, said method comprising:
   positioning at least one logic cell in a logic cell location area adjacent to a functional block of the integrated circuit;
   aligning the logic cell location area in-line with at least one logic cell row;
   aligning and connecting cell power supply wiring and cell ground wiring with respective wiring of the functional block, for supplying the at least one logic cell corresponding to the at least one logic cell location area; and
   positioning two cell power supply wirings between adjacent logic cell rows and corresponding adjacent logic cell location areas, each for supplying a logic cell located in a corresponding logic cell row or logic cell location area.

2. The power supply wiring method according to claim 1, wherein the logic cell location area is not within the functional block.

3. The power supply wiring method according to claim 1, wherein the integrated circuit comprises a plurality of functional blocks, the method further comprising positioning the at least one logic cell in the logic cell location area between the plurality of functional blocks.

4. The power supply wiring method according to claim 1, wherein the functional block includes a plurality of logic cell rows, the method further comprising aligning each of a plurality of logic cell location areas in-line with each of the plurality of logic cell rows.

5. The power supply wiring method according to claim 1, wherein the integrated circuit comprises a plurality of functional blocks each comprising a plurality of logic cell rows, the method further comprising:
   positioning the at least one logic cell in the logic cell location area between the plurality of functional blocks; and
   aligning each of the plurality of logic cell location areas in-line with each of the plurality of logic cell rows.

6. A semiconductor integrated circuit comprising:
   a functional block comprising at least one logic cell row including at least one logic cell;
   at least one logic cell corresponding to a logic cell location area adjacent to the functional block and aligned in-line with the at least one logic cell row; and
   cell power supply wiring and cell ground wiring aligned and connected with respective wiring of the functional block, for supplying the at least one logic cell corresponding to the at least one logic cell location area, wherein:
   cell power supply wirings are positioned between adjacent logic cell rows and corresponding adjacent logic cell location areas, each for supplying a logic cell located in a corresponding logic cell row or logic cell location area.

7. The semiconductor integrated circuit according to claim 6, wherein the logic cell location area is not within the functional block.

8. The semiconductor integrated circuit according to claim 6, further comprising:
   a plurality of functional blocks; and
   at least one logic cell corresponding to the logic cell location area between the plurality of functional blocks and aligned in-line with the at least one logic cell row.

9. The semiconductor integrated circuit according to claim 6, further comprising:
   a plurality of logic cell rows, wherein
   each of a plurality of logic cell location areas is aligned in-line with each of the plurality of logic cell rows.

10. The semiconductor integrated circuit according to claim 6, further comprising:
    a plurality of functional blocks, wherein:
    each of the plurality of functional blocks includes a plurality of logic cell rows, and
    each of a plurality of logic cell location areas is aligned in-line with each of the plurality of logic cell rows.

* * * * *